United States Patent [19]

Mathias et al.

[11] Patent Number: 4,725,478
[45] Date of Patent: Feb. 16, 1988

[54] HEAT-MINIATURIZABLE PRINTED CIRCUIT BOARD

[75] Inventors: Eckart Mathias, Catonsville; William A. Feehley, Kingsville, both of Md.

[73] Assignee: W. R. Grace & Co., New York, N.Y.

[21] Appl. No.: 772,515

[22] Filed: Sep. 4, 1985

[51] Int. Cl.⁴ .......................... B32B 3/00; B05D 3/02
[52] U.S. Cl. .................................... 428/207; 428/209; 428/901; 428/913; 427/96; 427/376.3; 156/84; 174/68.5
[58] Field of Search ............... 427/376.3; 156/84; 174/68.5; 339/17 T; 428/207, 209, 901, 913

[56] References Cited

U.S. PATENT DOCUMENTS

| | | |
|---|---|---|
| 2,692,190 | 8/1953 | Pritikin . |
| 2,721,822 | 7/1953 | Pritikin . |
| 3,181,986 | 3/1961 | Pritikin . |
| 3,350,498 | 10/1967 | Leeds . |
| 3,800,020 | 3/1974 | Parfet . |
| 4,115,185 | 9/1978 | Carlson . |
| 4,159,222 | 6/1979 | Lebow . |
| 4,440,823 | 4/1984 | Hoffmann . |
| 4,465,538 | 8/1984 | Schmoock . |
| 4,479,031 | 10/1984 | Ishise . |
| 4,487,994 | 12/1984 | Bahder . |
| 4,507,352 | 3/1985 | Shibata et al. ............ 428/201 |
| 4,526,807 | 7/1985 | Averbach ............ 427/53.1 |
| 4,604,298 | 8/1986 | Sheutchuk et al. ............ 427/96 |

FOREIGN PATENT DOCUMENTS 0112713 7/1982 Japan .

Primary Examiner—John E. Kittle
Assistant Examiner—Patrick J. Ryan
Attorney, Agent, or Firm—Richard P. Plunkett; William W. McDowell, Jr.

[57] ABSTRACT

The present invention relates to the manufacture of printed circuit boards and, particularly, to a process of miniaturizing said printed circuit board.

13 Claims, 2 Drawing Figures

HEAT-MINIATURIZABLE PRINTED CIRCUIT BOARD

BACKGROUND OF THE INVENTION

Since their discovery, printed circuit boards have become an essential part of almost every area of the electronics industry. Printed circuitry has been formed on ceramics, glazed metals and organic resin substrates for interconnecting of individual circuit components such as resistors, capacitors, inductors and semi-conductor devices. Printed circuitry has become the only economically viable technique for the interconnection of components in low as well as high volume production.

Conductive printed circuit patterns may vary from simple patterns of radially extending conductors for connecting an integrated circuit chip to a lead frame, to highly complex multilayer patterns for interconnecting a plurality of complex circuit components.

A variety of methods have been devised to produce these printed circuits and the prior art related thereto can be exemplified by such documentation as found in the form of U.S. Pat. Nos. 2,692,190, 2,721,822, 3,181,986, 3,350,498 and more recently 4,159,222, 4,440,823 and 4,465,538.

The supra enumerated and additional patent documentation on the art of developing printed circuitry clearly allows one to detect how the art has increasingly endeavored itself in essentially every phase of consumer, commercial, industrial, and military and aerospace applications to meet two conflicting demands. First, the complexity of the interconnection required, coupled with the inherent miniaturization of integrated circuits themselves have led to increased demands for further and further miniaturization of printed circuits in order to accommodate the desired integrated circuit functions within a package which is not to become so large as to lose the advantage of miniaturization in the interconnection process. Second, as circuit densities increase in response to the demand for miniaturization and the complexity and number of interconnections likewise increase, the opportunities for failures similarly increase thereby giving rise to a demand for inherently higher reliability of interconnection techniques. The response to these demands has been a series of improvements in printed circuit manufacturing processes with consequently higher densities and reliabilities being obtained.

The above should always be achieved at an affordable price to the ultimate consumer. The present invention addresses the issues of further miniaturization, reliability improvements and cost reductions of circuit boards.

DESCRIPTION OF THE PRIOR ART

Within the context of the application of heat shrinkable materials to the electrical/electronics area, they seem essentially limited to such uses as the provision of heat shrinkable protective sleeves for electrical cables and connections as evidenced by such prior art documentation as found, for example, in U.S. Pat. No. 4,479,031 and 4,487,994.

Within the more specific area of printed circuit boards, the prior art showing the use of any kind of heat shrinkable material does so within the context of describing the use of said materials to hold in place components to said boards. Thus, in DE No. 28 31 397, published Jan. 31, 1980, teachings are provided with respect to a retaining system for fixing components to a circuit board which includes use of a heat shrinkable insulating sheath which holds said components against said board. Furthermore, U.S. Pat. No. 3,800,020 describes a method of producing a printed circuit board making use of a heat softenable substrate in order to effect an improved bond between the applied conductor and said substrate, said substrate not being shrunk in the process.

Finally, teachings associating heat shrinkable materials with electronic applications also find documentation in the form of Swedish "Utlaggningsskrift" No. 7713-220-8, published Aug. 14, 1978, which describes a protective sleeve for a circuit board which is made of a heat shrinkable material, said sleeve being characterized in that it carried a conductive material for shielding the circuit against electromagnetic interference.

Nowhere in the prior art does there seem to be explicitly or implicitly an indication that the problem of miniaturizing a printed circuit in a cost effective way is solvable by using as a substrate for said printed circuit a heat shrinkable material. In fact, one prior art reference, U.S. Pat. No. 4,115,185, contrarywise addresses itself to the proposition of thermally dimensionally stabilizing a printed circuit board produced by the conventional etching technique which includes a plurality of steps comprising submitting said board to etching solutions, high temperature treatment solutions, hot oil baths, molten solder and the like.

Having thusly covered the subject invention's background and prior art, we now proceed with a description of its essence and of detailed embodiments thereof.

As stated previously, it has become an achievement of the subject invention to produce complex, dense, light weight printed circuits and boards therefor which can be miniaturized rapidly, easily and in a cost effective way.

BRIEF DESCRIPTION OF THE INVENTION

The present invention relates to the manufacture of printed circuit boards and, more particularly, to the manufacture of miniaturized screen-printed circuit boards.

It is a still further object of the present invention to provide a method of producing printed circuit boards which are easily miniaturizable, said method being a replacement for the more costly and time consuming print-and-etch method.

These and other objects of the present invention will become more obvious as the description of the invention proceeds.

DETAILED DESCRIPTION OF THE INVENTION

Accordingly, therefore, the subject invention characterizes itself in the provision of a novel method of producing high density, miniaturized printed circuits which are formed by employing screen-printing techniques using polymer thick film (PTF) conductive inks.

High-density PTF circuits require high density circuit packaging and compatibility with integrated circuit leads, which calls for circuit patterns with conductive elements at times as small as 2 mils (0.002 inch) wide. The conventional method of screen printing PTF patterns on a substrate cannot consistently produce patterns with line widths less than 8 to 10 mils. Photolithographic techniques have been used to produce PTF patterns with 2 mil wide conductors, but the process is complicated and costly.

Conventionally, additive, thick film circuit patterns are formed via a process which consists in the application of conductive and/or resistive "inks" onto ceramic substrates through a prepared pattern on a wire mesh or stencil. The deposited ink pattern and substrate are subsequently "fire" in a furnace to remove the solvents from the conductive "ink" paste, and the remaining material is sintered to the ceramic base. The reproduction of fine images on a screen or stencil is already difficult to achieve, and that is compounded by the tendency for the thick film paste to "slump" or run after it has been printed. These and other conditions combined generally limit the practical minimal width of lines and spacings of the printed elements on film circuits.

While line resolutions of 1 micron have been attained on semi-conductor integrated circuits, the best resolution that is currently commercially available for printed circuitry interconnecting non-monolithic circuit components is 5 mil wide lines on 10 mil centers.

These limitations in the fine line printing techniques used in the manufacture of printed circuitry therefore severely limit the degree to which a printed circuit could be miniaturized in a cost-efficient way and the need arose for devising an alternate technique of miniaturizing said printed circuits.

It was with the aforementioned objective in mind that a research program was set up to determine the feasibility of new concepts oriented at satisfying the ever increasing demand for production of complex, high density, light weight, low cost, printed circuitry on miniature-sized boards.

The subject invention was consummated when in the course of experimentation directed at the proposition of miniaturizing printed circuit boards the idea was conceived and put to practice of using polymeric heat shrinkable material as the substrate for said printed circuit boards which, after having had the printed circuitry deposited thereon, were easily, rapidly and inexpensively miniaturized by heat application.

Before expounding on this and other objects of the invention through a more detrailed description thereof, we must briefly focus on the subject of heat shrinkable materials and their utility thus far in the electronic technology area.

In essence, any polymer film which can be axially or biaxially oriented and heat shrunk is operable as a substrate herein including both crosslinked and non-crosslinked material. Heat shrinkable, polymeric materials are well known and amply documented in the prior art. Thus, heat shrinkable polymeric materials operable herein include, but are not limited to, polyethylene, polypropylene, polystyrene, polyamides, polyvinyl acetate, polyvinyl chloride, polyvinylidene chloride, polyesters and copolymers thereof. Methods of crosslinking the above are well known in the art and include both chemical methods and irradiation as by high energy electrons or ionizing radiation. These crosslinked materials usually contain up to 1 crosslink/1,000 molecular weight. Additionally, other heat shrinkable thermoplastic resins operable herein include rubbers such as natural rubber, silicone rubber, butyl rubber, ethylene-propylene copolymer rubbers and mixtures thereof.

Thus, the polymeric materials used as a substrate herein are those designed to heat shrink. The area shrinkage of these polymers when used in the instant invention is at least 10% and, preferably, at least 50%.

More specifically, the subject invention provides for the manufacture of polymer thick film (PTF) circuitry on polymeric substrates both of which lend themselves to drastic size reduction without accompanying loss of resolution by virtue of said printed circuitry being applied to a board or substrate which is made of a heat shrinkable material.

It is still a further object of the present invention to provide a method for miniaturizing printed circuit boards having the printed circuitry deposited thereon in the form of conductive inks through the screen-printing process, said method being characterized in that heat application to said board containing said conductive ink thereon accomplishes virtually simultaneously both (a) miniaturization of said board with said circuitry thereon and (b) cure of said conductive ink deposited on said board and forming said circuitry.

These and other aspects of the subject invention will become further elucidated as the description of said invention proceeds.

This invention was designed to make use of the so-called PTF inks to produce high density, fine-line resolution printed circuitry. The present invention thus provides a method for miniaturizing printed circuit boards through the use of said PTF inks at lower than usual conductive filler levels, by taking advantage of the low-cost screen printing process and by using heat shrinkable materials as substrate for said printed circuits, all of which contributing to enormously reduced cost for manufacturing diminutive printed circuitry.

The line definition of circuit boards made by the PTF technique is limited, inter alia generally by the fine-line screen printability of the inks used.

Several types of conductive inks have been used in the prior art, and as an example one may refer to W. R. Grace's U.S. Pat. No. 4,406,826 which teaches a heat curable, solventless, screen printable conductive ink composition comprising a polythiol in combination with an ethylenically unsaturated monomer.

In practicing the invention, it is also possible to employ radiation curable conductive inks such as those set out in U.S. Pat. Nos. 3,968,056 and 4,008,801. That is, one could apply the conductive ink by screen printing to the heat shrinkable substrate patternwise, subject the thus coated substrate to heat to cause the substrate to shrink and, thereafter, subject the conductive ink to UV radiation to cure it in situ.

Using solvent-based inks, the practical limit in production seems to be at about 10 mil wide lines with 10 mil wide spaces (i.e., 10/10). It takes a skillful and experienced printer to reproducibly print 6/6 lines/spaces.

In the present invention solventless inks were opted for since one can easily thereby print 5/5 dimensions. Furthermore, by combining the excellent fine-line printability of the solventless inks used with the heat shrinkability property of the board used as a substrate for said inks, 2.5/2.5 dimensions have been achieved. Theoretically, the smallest achievable dimensions will depend primarily on the initial screen printing resolution, which is a function of ink rheology and screen printing talent, and on the percentage of shrinkage achieved by the substrate used. Given that the amount of shrinkage of the substrate is the same in all directions, the area of the shrunken circuit can easily become less than one-fourth the area of the original unshrunken circuit/substrate. This constitutes a very significant reduction in the board's "real estate", a factor that is all-important in the miniaturization of electronic products.

Circuits made by the subject invention can be produced in a matter of minutes, and the cost of the conductive inks is primarily dependent on the conductive filler level used; levels of 70 to 75% by weight being most typical. Since the conductive trace shrinks as the substrate is heat shrunk, the point-to-point contact between the conductive particles is improved and, therefore, in the subject invention conductive inks with a lower than conventional conductive filler concentration may be used, a factor which contributes to the reduced cost which results from the printed circuit manufacture according to the embodiments of the present invention.

The feasibility of the present invention's concept is demonstrated by its reduction to practice in the form of the examples which will follow.

Generally, the procedure used was as follows:

A conductive ink test pattern was screen printed onto a shrinkable polystyrene substrate. This substrate was subsequently shrunk by heat application. In the experimentations carried out, the conductive ink was cured with UV radiation before and in other cases after the heat shrinking step. Better results, however, were obtained when, instead of curing said ink by UV irradiation, it was heat cured during the actual heat shrinking step of the said substrate although said heat cure may preferentially be undertaken immediately following said heat shrinking step. In either case, as reported supra, it was possible to produce high resolution patterns of excellent conductivity with lower than conventional concentrations of conductive filler in said conductive ink composition in view of the improved point-to-point contact which results from the heat shrank test circuitry pattern.

The heating step to shrink the substrate and cure the ink can be carried out by conventional means such as in a conventional air oven or in the hot vapor phase of conventional, commercially available liquids such as perfluorocarbons, water, etc.

In the heat curable conductive inks employed herein, conventional thermal initiators are usually added to the system. Such thermal initiators include, but are not limited to, free radical initiators selected from substituted or unsubstituted pinacols, thiurams, organic peroxides and mixtures thereof. A thermal initiator is added to the composition in an amount ranging from 0.001 to 10%, preferably 0.1 to 5%, by weight based on the weight of the ethylenically unsaturated group member in the ink.

When the curing of the ink is carried out by radiation, it is possible to either use UV radiation or ionizing radiation. When UV radiation is used, a photoinitiator is added to the ink. One class of photoinitiators are the aldehyde and ketone carbonyl compounds having at least one aromatic nucleus attached directly to the

group. Various of this type of photoinitiators include, but are not limited to, benzophenone, acetophenone, o-methoxy-benzophenone, acenaphthene-quinone, methyl ethyl ketone, valerophenone, hexanophenone, alpha-phenylbutyrophenone, p-morpholinopropiophenone, dibenzosuberone, 4-morpholino-benzophenone, 4'-morpholinodeoxybenzoin, p-diacetyl-benzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthrene-9-one, 7-H-benz[de]anthracen-7-one, 1-naphthaldehyde, 4,4'-bis(dimethylamino)benzophenone, fluorene-9-one, 1'-acetonaphthone, 2'-acetonaphthone, 2,3-butanedione, etc. Another class of photoinitiators is the substituted and unsubstituted benzoin ethers, such as benzoin methyl ether, benzoin ethyl ether, benzoin isopropyl ether, benzoin isobutyl ether, 2,2-dimethoxy-2-phenylacetophenone and the like. A third class of photoinitiators is exemplified by benzil dimethyl ketal. Other photoinitiators operable herein include triphenylphosphine and tri-o-tolyl phosphine. The photoinitiator or mixtures thereof are usually added in an amount ranging from 0.0005 to 10% by weight of the organic resin portion of the ink.

It should be noted that the present invention is operative with most other heat shrinkable materials besides polystyrene and, while experimentation with these was not conducted following through the whole miniaturization process, feasibility tests were conducted on the following materials: polyethylene, polypropylene, polyethylene/polypropylene copolymers and polyvinyl chloride.

The results of the feasibility tests were satisfactory enough to consider these materials appropriate candidates for use within the process parameters defining the subject invention; extent and rate of shrinkage were sufficient, and shrinkage was observed to be uniform longitudinally and latitudinally. Furthermore, other materials which could be considered as useful in the present invention are polytetrafluoroethylene/propylene, polyvinylidene fluoride, neoprene, silicone rubber, polyethylene terephthalate, i.e., a polyester film used in packaging, electrical and industrial applications, and "Tefzell", a DuPont product.

DESCRIPTION OF THE DRAWINGS

Our invention continues to be described hereinbelow in the full and concise terms required under 35 U.S.C. 112 by reference to the accompanying drawings, in which.

Figure 1:
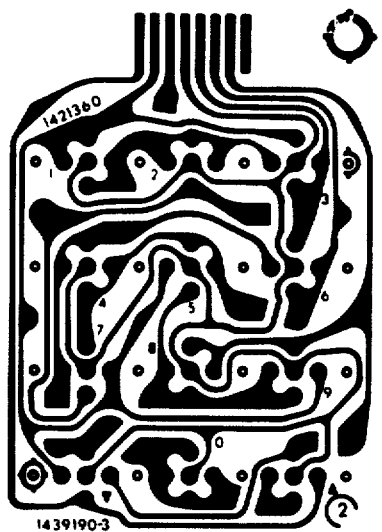
FIG. 1 is an actual size photographic depiction of the art work of the switch circuit which was used to form the image on the screen.
Figure 2:
FIG. 2 is a photographic depiction of the actual switch circuit formed after the heat shrinking and curing step using the screen formed from the art work in FIG. 1. The black area in FIG. 2 is the cured, silver containing, conductive ink.

The area depicted by the printed circuit board in FIG. 2 is smaller than one fifth of the area of said board as shown in FIG. 1 before the heat shrinking step.

The temperature to heat shrink the substrate will depend on which polymeric material is used as the substrate. Such heat shrinkable temperatures are well known to those skilled in the art. The heating range used of heat shrinking the polystyrene substrate was 120° C. to 160° C. with best results obtained at 150° C. for a heating duration of 5 to 10 minutes. Under these conditions shrinkage and cure are affected simultaneously. It can also be advantageous even though slightly more time consuming to carry out the heating process of the printed substrate in two steps; a first step at about 120° C. temperature, to bring about shrinkage, and a subsequent step at 150° C. to effect a final post-shrinkage in addition to cure of the conductive ink. Such an approach insures smoother texture of the substrate and conductive lines.

The following examples are set out to explain, but expressly not limit, the subject invention. Unless otherwise noted, all parts and percentages are by weight.

EXAMPLE 1

The ink used was a solventless heat curable acrylate-based conductive ink with benzopinacol as a thermal initiator containing 59 weight % silver filler. The substrate used was a 10-mil thick heat shrinkable polystyrene film. The ink was screen printed onto the substrate through a 325 mesh stainless steel screen with a circuit pattern having 8-mil wide lines and 4-mil wide spaces between the lines.

The substrate was shrunk and the ink cured (concurrently) by placing the inked substrate into the vapor phase of boiling Fluorinert TM L-9321 (BP 132° C.) for 5 minutes and immediately transferring into the vapor phase of boiling Fluorinert TM FC-40 (BP 155° C.) for 1 minute.

The sample was then allowed to cool to room temperature on a flat surface.

The line-space width measurements of the cured shrunken circuit were 4 mils and 2 mils, respectively, as measured under a 45× magnification with a Bausch & Lomb stereomicroscope. Resistance measurements for resistivity calculations were made with a Simpson (Model 461-2) digital multimeter, with film thicknesses being measured with a micrometer. A resistivity of $3.1 \times 10^{-5}$ ohm-cm was obtained.

EXAMPLES 2-16

The following examples show the ability to miniaturize printed circuits and the resistivities obtained. In Example 2 a conventional solvent-based ink, i.e., "Methode-1727", commercially available from Methode Development Co., Chicago, IL, containing 70-75% by weight, silver was used. The solvent was evaporated off prior to heating in the vapor phase. In Examples 3-16, a solventless, heat curable, acrylate-based conductive ink containing benzopinacol as a thermal initiator was employed. In all examples the inks were screen printed through a 325 mesh screen onto a polystyrene substrate. After printing, the substrates were shrunk and the ink cured by placing the inked substrates into the vapor phase of boiling Fluorinert TM L-9321 (BP 132° C.) for 5 minutes and immediately transferring the inked substrates into the vapor phase of boiling Fluorinert TM FC-40 (BP 155° C.) for 1 minute. The line/space ratios before and after shrinkage and the resistivity are shown in TABLE I:

TABLE I

| Example No. | Ink Type | Silver Level | Line/Space Before Shrinkage (mil/mil) | Line/Space After Shrinkage (mil/mil) | Resistivity (ohm-cm) |
| --- | --- | --- | --- | --- | --- |
| 2 | Conventional | 70-75 | 8/4 | 4/2 | $4.7 \times 10^{-3}$ |
| 3 | Solventless | 71.8 | 14/10 | 7/5 | $1.6 \times 10^{-4}$ |
| 4 | Solventless | 55 | 12/8 | 6/4 | $8.3 \times 10^{-5}$ |
| 5 | Solventless | 55 | 8/4 | 4/2 | $7.3 \times 10^{-5}$ |
| 6 | Solventless | 55 | 12/8 | 6/4 | $1.6 \times 10^{-3}$ |
| 7 | Solventless | 55 | 12/8 | 6/4 | $3.1 \times 10^{-4}$ |
| 8 | Solventless | 71.8 | 12/8 | 6/4 | $1.0 \times 10^{-4}$ |
| 9 | Solventless | 71.8 | 8/4 | 4/2 | $7.8 \times 10^{-5}$ |
| 10 | Solventless | 55 | 10/10 | 5/5 | $1.4 \times 10^{-4}$ |
| 11 | Solventless | 57 | 10/10 | 5/5 | $4.2 \times 10^{-5}$ |
| 12 | Solventless | 57 | 8/4 | 4/2 | $3.6 \times 10^{-5}$ |
| 13 | Solventless | 59 | 8/4 | 4/2 | $3.1 \times 10^{-5}$ |
| 14 | Solventless | 59 | 12/8 | 6/4 | $2.6 \times 10^{-5}$ |
| 15 | Solventless | 61 | 12/8 | 6/4 | $4.7 \times 10^{-5}$ |
| 16 | Solventless | 61 | 12/8 | 6/4 | $4.2 \times 10^{-5}$ |

EXAMPLE 17

A conductive ink was made up of acrylic prepolymers, benzophenone as a photoinitiator and 54 weight percent of the ink of silver particles. The ink was screen printed through a 325 mesh screen to give 10 mil-wide lines with 10 mil-wide spaces therebetween on a polystyrene substrate. The inked substrate was heated at 150° C. for 10 minutes and then exposed to UV radiation from a Colight UV lamp for 24 seconds. The resultant ink had a resistivity of $1.2 \times 10^{-3}$ ohm-cm, and the shrunken printed circuit had lines of 5 mil-width with 5 mil-spaces therebetween.

We claim:

1. A process for miniaturizing printed circuitry which comprises depositing a curable conductive ink in a desired pattern on a heat shrinkable polymeric substrate and, thereafter, applying heat to said substrate to simultaneously or successively shrink said substrate and cure said ink.

2. The process according to claim 1 wherein the heating is carried out in two steps, firstly at 120° C. to initiate shrinkage of said substrate and subsequently at about 150° C. to effect final shrinkage of said substrate and curing of the conductive ink.

3. The process according to claim 1 wherein the shrinking of said substrate and the curing of said ink is carried out simultaneously at a temperature of at least 150° C.

4. The process according to claim 1 wherein said heat shrinkable polymeric substrate is polystyrene.

5. The process according to claim 1 wherein said conductive ink is solventless.

6. The process according to claim 1 wherein said conductive ink is deposited on said heat shrinkable polymeric substrate via a screen printing method.

7. The process according to claim 1 wherein the printed circuit area reduction achieved without detrimentally effecting tracing resolution and conductivity is at least four-fold.

8. An article comprising a curable conductive ink on a heat shrinkable polymeric substrate.

9. The article of claim 8 wherein the conductive ink is solventless.

10. The article of claim 8 wherein the conductive ink is present in a circuit pattern.

11. An article comprising a cured conductive ink on a heat shrunken polymeric substrate.

12. The article of claim 11 wherein the conductive ink is present in a circuit pattern.

13. A process from miniaturizing a printed circuit which comprises screen printing in a circuit pattern, a conductive ink onto a heat shrinkable polymeric substrate and then in either order
   (1) heating the thus printed substrate to a temperature sufficient to cause said substrate to shrink and
   (2) exposing the printed substrate to UV radiation for a time sufficient to cure said conductive ink.

* * * * *

UNITED STATES PATENT AND TRADEMARK OFFICE
CERTIFICATE OF CORRECTION

PATENT NO. : 4,725,478
DATED : February 16, 1988
INVENTOR(S) : Eckart Mathias

It is certified that error appears in the above-identified patent and that said Letters Patent is hereby corrected as shown below:

<u>In the Claims</u>:

In column 9, claim 13, line 1; delete the word "from" and insert therefor the word --for--.

In column 9, claim 13, line 2; after the word "pattern" delete the --,--.

Signed and Sealed this

Fifth Day of July, 1988

Attest:

DONALD J. QUIGG

*Attesting Officer*       *Commissioner of Patents and Trademarks*